US006342732B1

(12) United States Patent
Ochiai et al.

(10) Patent No.: US 6,342,732 B1
(45) Date of Patent: Jan. 29, 2002

(54) CHIP-TYPE MULTILAYER ELECTRONIC PART

(75) Inventors: Toshiaki Ochiai; Tetuji Maruno; Akira Sasaki; Kazuhiko Kikuchi, all of Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 09/397,013

(22) Filed: Sep. 15, 1999

(30) Foreign Application Priority Data

Sep. 18, 1998 (JP) .......................................... 10-264515

(51) Int. Cl.$^{7}$ ......................... H01L 23/48; H01L 23/52; H01L 29/40

(52) U.S. Cl. ....................... 257/734; 257/762; 257/767; 257/768; 257/769

(58) Field of Search ................................ 257/734, 762, 257/767, 769, 768, 757

(56) References Cited

U.S. PATENT DOCUMENTS

| | | | | |
|---|---|---|---|---|
| 4,101,710 A | * | 7/1978 | Marcus | 428/472 |
| 5,119,062 A | * | 6/1992 | Nakamura et al. | 338/20 |
| 5,548,474 A | * | 8/1996 | Chen et al. | 361/313 |
| 5,650,368 A | * | 7/1997 | Tateishi et al. | 501/139 |
| 5,870,273 A | * | 2/1999 | Sogabe et al. | 361/306.3 |
| 6,051,171 A | * | 4/2000 | Takeuchi et al. | 264/40.1 |

FOREIGN PATENT DOCUMENTS

| | | | |
|---|---|---|---|
| JP | 62-84918 | | 5/1987 |
| JP | 3-230508 | | 10/1991 |
| JP | 4-320017 | | 11/1992 |
| JP | 6-61089 | | 3/1994 |
| JP | 6-342734 | | 12/1994 |
| JP | 07161576 A | * | 6/1995 |
| JP | 7-93229 | | 10/1995 |

* cited by examiner

*Primary Examiner*—Eddie Lee
*Assistant Examiner*—Chris C. Chu
(74) *Attorney, Agent, or Firm*—Oblon, Spivak, McClelland, Maier & Neustadt, P.C.

(57) ABSTRACT

A chip-type multi-layered electronic part in which terminal electrodes are prevented from oxidization when the electrical part is joined with a substrate, so that superior electrical bonding between the terminal electrodes and internal electrodes can be attained. Terminal electrodes 7 connected to internal electrodes 1 contain silver and palladium as the main ingredients in the weight ratio in a range of from 7:3 to 3:7, and further contain boron in a range of from 0.1 weight percent to 1.0 weight percent added to the main ingredients of 100 weight percent.

12 Claims, 2 Drawing Sheets

CHIP-TYPE MULTILAYER ELECTRONIC PART

BACKGROUND OF THE INVENTION

The present invention relates to a chip-type multi-layer electronic part having internal electrodes, and particularly relates to the composition of the terminal electrodes.

In a chip-type multi-layered electronic part, for example, in a multi-layered chip capacitor, generally a plurality of ceramic green sheets provided with an internal electrode of nickel, copper, silver, silver/palladium, or the like are laminated and baked so as to form a capacitor chip 2 constituted by a dielectric laminated body including internal electrodes 1, as shown in FIG. 2. Terminal electrodes 3 containing copper, silver or silver/palladium alloy as their main ingredients and having electrical conduction to the internal electrodes 1 are formed in both end portions of the chip 2 by baking or the like. After that, a nickel layer 3*a* and a tin or tin alloy layer 3*b* are provided by electrolytic plating. The chip-type multi-layered electronic part configured thus is joined with a land 5 on a substrate 4 through solder or conductive resin 6.

In the chip-type multi-layered electronic part shown in FIG. 2, there is a problem that the surface of the terminal electrodes 3 is oxidized easily by heating when the chip-type multi-layered electronic part is joined with the substrate 4 through the conductive resin 6, so that failure in conduction is caused by the oxidization. In addition, there is a problem that if the internal electrodes 1 is made of base metal such as nickel, copper or the like, they are apt to be oxidized when the terminal electrodes 3 are formed by baking or the like, and failure in conduction occurs easily.

SUMMARY OF THE INVENTION

Taking the foregoing problems into consideration, it is an object of the present invention to provide a chip-type multi-layered electronic part in which terminal electrodes are prevented from oxidization when the terminal electrodes are joined with a substrate by heating, so that superior electrical bonding with internal electrodes can be attained.

In addition, it is another object of the present invention to provide a chip-type multi-layered electronic part in which the internal electrodes are prevented from oxidization when the terminal electrodes are formed, so that superior electrical bonding between the terminal electrodes and the internal electrodes can be attained.

According to the present invention, there is provided a chip-type multi-layered electronic part comprising: internal electrodes each of which is made of metal; and terminal electrodes suitably connected to the internal electrodes, each of the terminal electrodes containing silver and palladium as main ingredients thereof in a weight ratio in a range of from 7:3 to 3:7, and further containing boron in a range of from 0.1 weight percent to 1.0 weight percent added to the main ingredients of 100 weight percent.

By making the terminal electrodes have such composition, lead-out portions of the internal electrodes are prevented from oxidization when the terminal electrodes are baked, so that the contact between the terminal electrodes and the lead-out electrodes, can be kept satisfactory.

In addition, the terminal electrodes are prevented from oxidization, so that it is possible to prevent increase in resistance values of the terminal electrode portions and the internal electrodes, and it is possible to prevent deterioration in electrical characteristics, such as reduction in Q-value or the like, due to the increase in those resistance values. When the percentage of palladium is smaller than the above-mentioned silver/palladium weight ratio of 7:3, there arises failure in joining between the internal electrodes and the terminal electrodes. On the contrary, when the percentage of palladium is larger than the above-mentioned weight ratio of 7:3, there appears oxidization in the terminal electrodes, thereby causing the above-mentioned deterioration in electrical characteristics.

When the loading of boron is less than 0.1 weight percent, the effect of adding boron cannot be expected so much and the internal electrodes are apt to be oxidized. On the contrary, when the loading of boron exceeds 1.0 weight percent, baking the terminal electrodes is blocked so that the internal electrodes are apt to be oxidized.

According to the invention, preferably, the internal electrodes is made of nickel. When the internal electrodes is made of nickel, the present invention can exert a more valid effect in the sense of preventing the internal electrodes from oxidization when the terminal electrodes are formed and when the terminal electrodes are heated and attached to a substrate.

Preferably, each of the terminal electrodes has a one-layer structure having no surface plated layer.

If the terminal electrodes are made thus to have a one-layer structure, it is possible to restrain the terminal electrodes from oxidization when they are joined through conductive resin, so that it is possible to make them suitable for mounting the chip-type multi-layered electronic part on a substrate through the conductive resin.

DETAILED DESCRIPTION OF THE PREFERRED EMBODIMENTS

Figure 1:
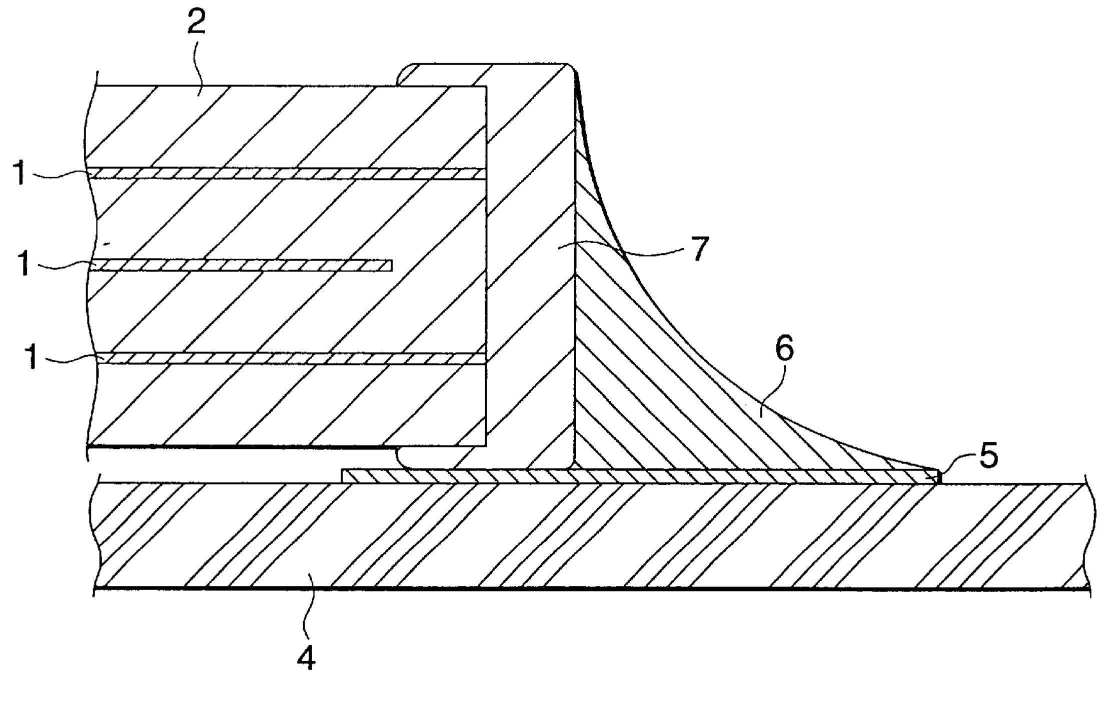
FIG. 1 is a sectional view showing an embodiment of a multi-layered ceramic capacitor which is an example of a chip-type multi-layered electronic part according to the present invention.

FIG. 1 is a sectional view showing a multi-layered chip capacitor, as an example of a chip-type multi-layered electronic part, in a state of being mounted on a substrate. This capacitor is formed in such a manner that dielectric layers and nickel layers are laminated by sheeting or screen printing, contact-joined and cut into every chip 2, and baked in a non-oxygen atmosphere, so as to bake terminal electrodes 7. The reference numeral 1 represents an internal electrode made of nickel; 4, a substrate; 5, a land on the substrate 4; and 6, conductive resin for bonding the terminal electrode 7 to the land 5 and mounting the capacitor on the substrate 4.

In this embodiment, internal electrodes 1 made of nickel were printed on ceramic green sheets including barium titanate as dielectric material, and these sheets were laminated. After these laminated sheets were cut by chip, paste containing silver/palladium as its main ingredients with boron added or not added thereto for forming terminal electrodes 7 was applied to the chip, and then the chip was baked at 900° in a nitrogen atmosphere so as to form the terminal electrodes 7. The composition of these terminal electrodes 7 is shown in Table 1.

TABLE 1

| No | Ag/Pd | B loading (parts by weight) |
|---|---|---|
| 1 | 8:2 | 0 |
| 2 | | 0.05 |
| 3 | | 0.1 |
| 4 | | 0.5 |
| 5 | | 1.0 |
| 6 | | 1.5 |
| 7 | 7:3 | 0 |
| 8 | | 0.05 |
| 9 | | 0.1 |
| 10 | | 0.5 |
| 11 | | 1.0 |
| 12 | | 1.5 |
| 13 | 6:4 | 0 |
| 14 | | 0.05 |
| 15 | | 0.1 |
| 16 | | 0.5 |
| 17 | | 1.0 |
| 18 | | 1.5 |
| 19 | 5:5 | 0 |
| 20 | | 0.05 |
| 21 | | 0.1 |
| 22 | | 0.5 |
| 23 | | 1.0 |
| 24 | | 1.5 |
| 25 | 4:6 | 0 |
| 26 | | 0.05 |
| 27 | | 0.1 |
| 28 | | 0.5 |
| 29 | | 1.0 |
| 30 | | 1.5 |
| 31 | 3:7 | 0 |
| 32 | | 0.05 |
| 33 | | 0.1 |
| 34 | | 0.5 |
| 35 | | 1.0 |
| 36 | | 1.5 |
| 37 | 2:8 | 0 |
| 38 | | 0.05 |
| 39 | | 0.1 |
| 40 | | 0.5 |
| 41 | | 1.0 |
| 42 | | 1.5 |

As shown in Table 1, silver and palladium which were main ingredients of the terminal electrodes 7 were mixed in the form powder while their weight ratio was changed to 8:2, 7:3, 6:4, 5:5, 4:6, 3:7 and 2:8, and 0 weight percent, 0.05 weight percent, 0.1 weight percent, 0.5 weight percent, 1.0 weight percent and 1.5 weight percent of powder of boron were added to these main ingredients of 100 weight percent. Paste obtained thus was applied, and baked in a nitrogen atmosphere so as to form the terminal electrodes 7.

Figure 2:
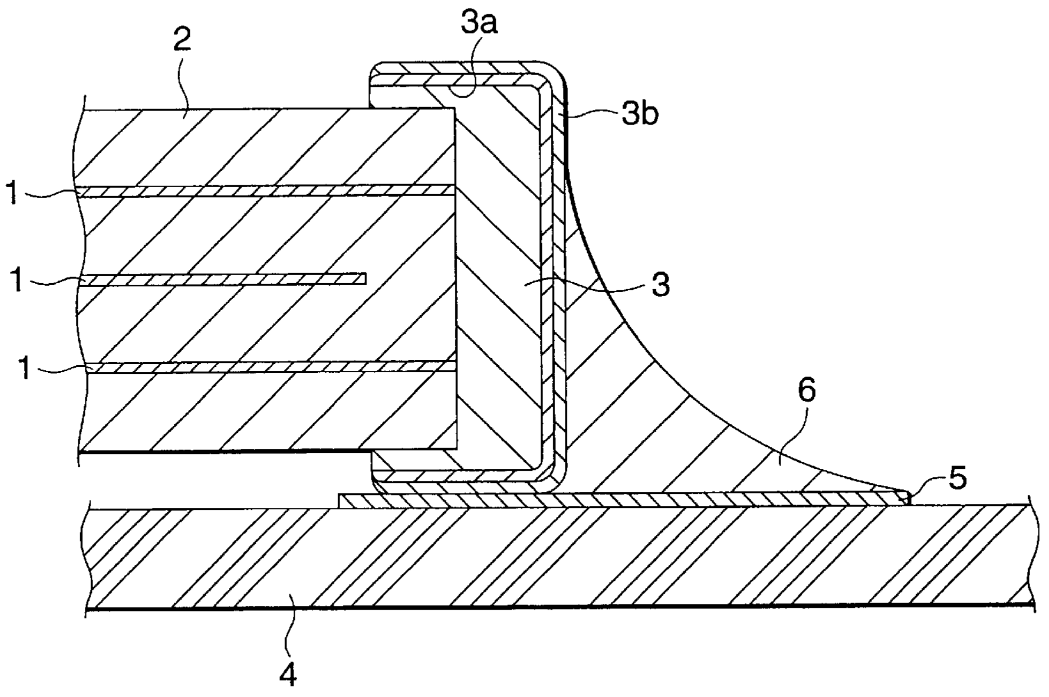
PRIOR ART FIG.2
FIG. 2 is a sectional view showing an example of a background-art multi-layered ceramic capacitor.

As a comparative example, paste containing copper as its main ingredient was applied to a capacitor chip 2 having internal electrodes made of nickel, and baked at 750° C. in a nitrogen atmosphere, so as to form terminal electrodes 3, as shown in FIG. 2. A nickel plated layer 3*a* and a tin plated layer 3*b* were formed on each of the terminal electrodes 3 by electrolysis.

Every five samples produced thus were joined onto an alumina substrate 4 through conductive resin 6, and their electric characteristics were examined after they were left alone in a high-temperature tank of 180° C., 200° C., 250° C. or 300° for 100 hours. This examination of the electrical characteristics was performed by connecting and fixing the terminal electrodes 7 of each sample onto lands formed separately on a test substrate through conductive bonding adhesive, and measuring the capacitance, the dielectric loss and the insulation resistance, respectively, before the sample was put into the high-temperature tank and after the sample was taken out of the tank and left for 24 hours at room temperature. In Table 2, "o" designates that no deterioration appeared in the capacitance, the dielectric loss and the insulation resistance before and after the sample was put into the high-temperature tank; "x" designates that deterioration was found; and "-" designates that measurement was not performed.

As is apparent from Table 2, in the samples No. 1, 2, 7, 8, 13, 14, 19, 20, 25, 26, 31, 32, 37 and 38 where boron powder was not added, or 0.05 weight percent of boron powder were added, oxization of nickel occurred in the lead-out portions of the internal electrodes 1 for connection with the terminal electrodes 7. This oxidization caused deterioration in the electrical characteristics.

TABLE 2

| No. | Ag/Pd | B loading (weight percent) | 180° C. | 200° C. | 250° C. | 300° C. |
|---|---|---|---|---|---|---|
| 1 | 8:2 | 0 | ○ | ○ | x | — |
| 2 | | 0.05 | ○ | ○ | x | — |
| 3 | | 0.1 | ○ | ○ | x | — |
| 4 | | 0.5 | ○ | ○ | x | — |
| 5 | | 1.0 | ○ | ○ | x | — |
| 6 | | 1.5 | ○ | x | — | — |
| 7 | 7:3 | 0 | ○ | ○ | x | — |
| 8 | | 0.05 | ○ | ○ | x | — |
| 9 | | 0.1 | ○ | ○ | ○ | ○ |
| 10 | | 0.5 | ○ | ○ | ○ | ○ |
| 11 | | 1.0 | ○ | ○ | ○ | ○ |
| 12 | | 1.5 | ○ | x | — | — |
| 13 | 6:4 | 0 | ○ | ○ | x | — |
| 14 | | 0.05 | ○ | ○ | x | — |
| 15 | | 0.1 | ○ | ○ | ○ | ○ |
| 16 | | 0.5 | ○ | ○ | ○ | ○ |
| 17 | | 1.0 | ○ | ○ | ○ | ○ |
| 18 | | 1.5 | ○ | x | — | — |
| 19 | 5:5 | 0 | ○ | ○ | x | — |
| 20 | | 0.05 | ○ | ○ | x | — |
| 21 | | 0.1 | ○ | ○ | ○ | ○ |
| 22 | | 0.5 | ○ | ○ | ○ | ○ |
| 23 | | 1.0 | ○ | ○ | ○ | ○ |
| 24 | | 1.5 | ○ | x | — | — |
| 25 | 4:6 | 0 | ○ | ○ | x | — |
| 26 | | 0.05 | ○ | ○ | x | — |
| 27 | | 0.1 | ○ | ○ | ○ | ○ |
| 28 | | 0.5 | ○ | ○ | ○ | ○ |
| 29 | | 1.0 | ○ | ○ | ○ | ○ |
| 30 | | 1.5 | ○ | x | — | — |
| 31 | 3:7 | 0 | ○ | ○ | x | — |
| 32 | | 0.05 | ○ | ○ | x | — |
| 33 | | 0.1 | ○ | ○ | ○ | ○ |
| 34 | | 0.5 | ○ | ○ | ○ | ○ |
| 35 | | 1.0 | ○ | ○ | ○ | ○ |
| 36 | | 1.5 | ○ | x | — | — |
| 37 | 2:8 | 0 | ○ | ○ | x | — |
| 38 | | 0.05 | ○ | ○ | x | — |
| 39 | | 0.1 | ○ | ○ | ○ | x |
| 40 | | 0.5 | ○ | ○ | ○ | x |
| 41 | | 1.0 | ○ | ○ | ○ | x |
| 42 | | 1.5 | ○ | x | — | — |
| 43 | Comparative Example | | ○ | x | — | — |

On the other hand, in the samples No. 6, 12, 18, 24, 30, 36 and 42 in which the boron exceeded 1.5 weight percent, the electrical characteristics deteriorated when the temperature reached 200° C. or more. It is considered that this deterioration was caused by the oxidization of nickel constituting the internal electrodes 1, and too much powder of boron blocked the baking of the terminal electrodes 7 so that plenty of open pores were left, thereby causing the oxidization of nickel.

In addition, in the samples No. 3 to 5 shown in Table 2, that is, in the case where the weight ratio of silver to palladium was 8:2, the connection between the internal electrodes 1 and the terminal electrodes 7 was failed at 250° C., and the electrical characteristics deteriorated, even if the loading of boron powder was 0.1 to 1.0 weight percent.

In addition, in the samples No. 39 and 40, that is, in the case where the weight ratio of silver to palladium was 2:8, the terminal electrodes 7 were oxidized at 300° C., and the electrical characteristics deteriorated, even if the loading of boron powder was 0.1 to 1.0 weight percent.

On the other hand, if the weight ratio of silver to palladium was within a range of from 7:3 to 3:7 and the loading of boron powder was within a range of from 0.1 to 1.0 weight percent (No. 9 to 11, 15 to 17, 21 to 23, 27 to 29, and 33 to 35), the electrical characteristics did not deteriorate even if being heated at 300° C. This shows that the loading of boron powder restrained the oxidization of the internal electrodes 1 made of nickel.

As mentioned above, in the comparative example where copper was used for the terminal electrodes 3 and the nickel plated layer 3*a* and the tin plated layer 3*b* were formed on the surface of each of the electrodes 3, the electrical characteristics deteriorated due to heating at 200° C., as shown in Table 2. The tin plated layer 3*b* was softened and lost by heating and the nickel plated layer 3*a* was therefore oxidized, so that the electrical characteristics deteriorated.

Differently from the above-mentioned examination of the electrically characteristics, the average bonding strength between the chip 2 and the terminal electrodes 3 or 7 was examined on every five pieces of each of the above-mentioned samples NO. 4, 10, 16, 22, 28, 34, 40 and the comparative example sample No. 43. The results are shown in Table 3.

As is apparent from Table 3, the bonding strength of the terminal electrodes 7 increased as the ratio of palladium increased in the weight ratio of silver to palladium. Although the bonding strength in the sample No. 10 according to the embodiment of the present invention was smaller than that in the comparative example, the bonding strength endurable to use was ensured.

TABLE 3

| No | Ag/Pd | bonding strength (Average) (Kg) |
|---|---|---|
| 4 | 8:2 | 1.8 |
| 10 | 7:3 | 2.1 |
| 16 | 6:4 | 2.7 |
| 22 | 5:5 | 4.9 |
| 28 | 4:6 | 5.3 |
| 34 | 3:7 | 5.7 |
| 40 | 2:8 | 6.0 |
| comparative example | — | 4.8 |

The present invention is applicable also to the case where the chip-type multi-layered electronic part is, not a capacitor, but an inductor; a resonator or a filter in which inductors made of nickel or other materials are piled up as internal electrodes of a capacitor; or a lamination in which resistance layers are piled up.

In addition, the present invention is applicable also to the case where copper, silver, silver/palladium, etc. other than nickel is used for the internal electrodes 1 so as to obtain an effect to prevent oxidization when the chip is mounted on a substrate. In addition, even if such electrolytically plated layers 3*a* and 3*b* as provided in the comparative example or in the background art are provided on the surface of the terminal electrodes 7 in the present invention, it is possible to obtain an effect to restrain oxidization of the above-mentioned internal electrodes 1 made of nickel or the like. However, when the chip has a one-layer structure without providing the electrolytically plated layers 3*a* and 3*b* as shown in FIG. 1, the problem of oxidization of the terminal electrodes 7 when they are joined through the conductive resin 6 can be solved. Accordingly, no problem is caused in the case of a chip-type multi-layered electronic part which is mounted through the conductive resin 6.

In addition, silver and palladium may be baked as alloy powder having a predetermined weight ratio, instead of a separate mixture of silver powder and palladium powder.

According to the invention, internal electrodes made of nickel, and terminal electrodes contain silver and palladium as the main ingredients in the weight ratio in a range of from 7:3 to 3:7, and further contain boron powder in a range of from 0.1 weight percent to 1.0 weight percent added to this main ingredients of 100 weight percent. Accordingly, it is possible to prevent the terminal electrodes and the internal electrodes of nickel from oxidization, and it is possible to improve the electrical characteristics.

Additionally, the internal electrodes made of nickel. Accordingly, the present invention has a more valid effect in the sense of preventing the internal electrodes from oxidization when the terminal electrodes are formed and heated so as to be joined with a substrate.

Moreover, the terminal electrodes have a one-layer structure with no surface plated layer. Accordingly, it is possible to restrain the terminal electrodes from oxidization when they are joined through conductive resin, so that it is possible to make the terminal electrodes suitable for being mounted on a substrate through the conductive resin.

What is claimed is:

1. A chip-type laminated electronic part comprising:

internal metal electrodes; and terminal electrodes suitably connected to said internal metal electrodes, each of said terminal electrodes containing silver and palladium as main ingredients thereof in a weight ratio in a range, of from 7:3 to 3:7, and further containing boron in a range of from 0.1 weight percent to 1.0 weight percent added to said main ingredients of 100 weight percent.

2. A chip-type laminated electronic part according to claim 1, wherein said internal metal electrodes is made of nickel.

3. A chip-type laminated electronic part according to claim 1, wherein each of said terminal electrodes has a one-layer structure having no surface plated layer.

4. A chip-type laminated electronic part according to claim 2, wherein each of said terminal electrodes has a one-layer structure having no surface plated layer.

5. A chip-type laminated electronic part comprising:

internal metal electrodes; and terminal electrodes suitably connected to said internal metal electrodes, each of said terminal electrodes containing silver and palladium as main ingredients thereof in a weight ratio in a range of from 7:3 to 3:7, and further an additive consisting of boron in a range of from 0.1 weight percent to 1.0 weight percent added to said main ingredients of 100 weight percent.

6. A chip-type laminated electronic part according to claim 5, wherein said internal metal electrodes is made of nickel.

7. A chip-type laminated electronic part according to claim 5, wherein each of said terminal electrodes has a one-layer structure having no surface plated layer.

8. A chip-type laminated electronic part according to claim 5, wherein each of said terminal electrodes has a one-layer structure having no surface plated layer.

9. A chip-type laminated electronic part comprising:

internal metal electrodes; and terminal electrodes suitably connected to said internal metal electrodes, each of said terminal electrodes containing silver and palladium as main ingredients thereof in a weight ratio in a range of from 7:3 to 3:7, and further an additive consisting of boron in a range of from 0.1 weight percent to 1.0 weight percent added to said main ingredients of 100 weight percent.

10. A chip-type laminated electronic part according to claim 9, wherein said internal metal electrodes is made of nickel.

11. A chip-type laminated electronic part according to claim 9, wherein each of said terminal electrodes has a one-layer structure having no surface plated layer.

12. A chip-type laminated electronic part according to claim 10, wherein each of said terminal electrodes has a one-layer structure having no surface plated layer.

* * * * *